United States Patent
Chen

(10) Patent No.: US 9,960,215 B2
(45) Date of Patent: May 1, 2018

(54) ORGANIC ELECTROLUMINESCENT DISPLAY DEVICE

(71) Applicants: BOE Technology Group Co., Ltd., Beijing (CN); Hefei Boe Optoelectronics Technology Co., Ltd., Anhui (CN)

(72) Inventor: Changdi Chen, Beijing (CN)

(73) Assignees: BOE Technology Group Co., Ltd., Beijing (CN); Hefei BOE Optoelectronics Technology Co., Ltd., Anhui (CN)

( * ) Notice: Subject to any disclaimer, the term of this patent is extended or adjusted under 35 U.S.C. 154(b) by 0 days. days.

(21) Appl. No.: 15/140,818

(22) Filed: Apr. 28, 2016

(65) Prior Publication Data

US 2017/0084878 A1    Mar. 23, 2017

(30) Foreign Application Priority Data

Sep. 18, 2015   (CN) .......................... 2015 1 0601333

(51) Int. Cl.
| | |
|---|---|
| *H01L 51/52* | (2006.01) |
| *G02B 1/08* | (2006.01) |
| *H01L 27/32* | (2006.01) |
| *G02B 5/30* | (2006.01) |

(52) U.S. Cl.
CPC ............ *H01L 27/3232* (2013.01); *G02B 1/08* (2013.01); *G02B 5/3033* (2013.01); *H01L 51/5253* (2013.01); *H01L 51/5281* (2013.01)

(58) Field of Classification Search
None
See application file for complete search history.

(56) References Cited

U.S. PATENT DOCUMENTS

| | | | | |
|---|---|---|---|---|
| 2010/0177175 | A1* | 7/2010 | Chen ...................... | G02B 27/26 348/58 |
| 2010/0215929 | A1* | 8/2010 | Seo ..................... | H01L 51/5237 428/213 |
| 2011/0285834 | A1* | 11/2011 | Wu ...................... | G02B 27/286 348/58 |
| 2012/0099054 | A1* | 4/2012 | Takeuchi ............... | G02B 5/201 349/98 |
| 2012/0253061 | A1* | 10/2012 | Takahashi .............. | G02B 27/26 560/158 |
| 2012/0287379 | A1* | 11/2012 | Koike ............... | G02F 1/133528 349/96 |
| 2012/0307359 | A1* | 12/2012 | Matsuyama ....... | H04N 13/0434 359/465 |
| 2012/0320457 | A1* | 12/2012 | Horikoshi ............. | G02B 27/26 359/465 |

(Continued)

FOREIGN PATENT DOCUMENTS

| | | |
|---|---|---|
| CN | 102498421 A | 6/2012 |
| CN | 102956673 A | 3/2013 |

(Continued)

OTHER PUBLICATIONS

Sep. 2, 2016—(CN)—First Office Action Appn 201510601333.4 with English Tran.

(Continued)

*Primary Examiner* — Michael Lebentritt
*Assistant Examiner* — Jordan Klein
(74) *Attorney, Agent, or Firm* — Banner & Witcoff, Ltd.

(57) ABSTRACT

An organic electroluminescent display device is provided. The display device has a polarizing film disposed at a light exiting side thereof. The polarizing film has a plurality of polarization units, and adjacent polarization units have different polarization directions.

10 Claims, 2 Drawing Sheets

(56) References Cited

U.S. PATENT DOCUMENTS

| | | | |
|---|---|---|---|
| 2014/0097412 A1* | 4/2014 | Kuo | G02B 5/30 |
| | | | 257/40 |
| 2014/0313581 A1* | 10/2014 | Kashima | G02B 5/3016 |
| | | | 359/489.07 |
| 2015/0346522 A1* | 12/2015 | Hilarius | G02F 1/0316 |
| | | | 359/259 |
| 2016/0033782 A1 | 2/2016 | Wang | |
| 2016/0139461 A1* | 5/2016 | Kwon | G02F 1/133528 |
| | | | 359/484.01 |
| 2016/0249045 A1 | 8/2016 | Xu | |

FOREIGN PATENT DOCUMENTS

| | | | |
|---|---|---|---|
| CN | 103852896 A | 6/2014 | |
| CN | 104038754 A | 9/2014 | |
| CN | 104321689 A | 1/2015 | |
| CN | 104516043 A | 4/2015 | |
| JP | 2005250220 A | 9/2005 | |
| JP | 201237275 A | 2/2012 | |
| JP | 201274221 A | 4/2012 | |
| JP | 2014106382 A | 6/2014 | |
| TW | 201027125 A1 | 7/2010 | |

OTHER PUBLICATIONS

Apr. 21, 2017—(CN) Second Office Action Appn 201510601333.4 with English Tran.
Aug. 25, 2017—(CN) Third Office Action Appn 201510601333.4 with English Tran.
Dec. 12, 2017—(CN) Fourth Office Action Appn 201510601333.4 with English Tran.

\* cited by examiner

ORGANIC ELECTROLUMINESCENT DISPLAY DEVICE

This application claims priority to and the benefit of Chinese Patent Application No. 201510601333.4 filed on Sep. 18, 2015, which application is incorporated herein in its entirety.

TECHNICAL FIELD

Embodiments of the present invention relate to an organic electroluminescent display device.

BACKGROUND ART

When an organic electroluminescent display device is produced, it is usually necessary to package the whole display device with a sealing film. However, because a thickness of the sealing film of the organic electroluminescence is in a same order of magnitude as wavelengths of visible lights, a wide-angle interference takes place between a transmitted light irradiating directly from a light exiting side and a reflected light from reflective electrode. Thus, the light extraction efficiency is reduced.

SUMMARY OF THE INVENTION

The embodiment of the present disclosure provides an organic electroluminescent display device, at a light exiting side of which, there is provided a polarizing film, the polarizing film possessing a plurality of polarization units, and polarization directions of adjacent polarization units differ.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

In order to improve the light extraction efficiency of organic electroluminescent display devices, and further to improve the display effect of organic electroluminescent display devices, an organic electroluminescent display device is provided by embodiments of the invention. In technical solutions of embodiments of the present invention, a polarizing film is provided at a light exiting side of the organic electroluminescent display device, so that polarization directions of outgoing lights are different, and interferences decreased. Thus, light extraction efficiency is increased, and eventually, display effect of the display device is improved. For the sake of facilitate understanding of technical solutions of the present invention, technical solutions of the invention will be described below in detail in conjunction with attached drawings and specific embodiments.

Figure 1:
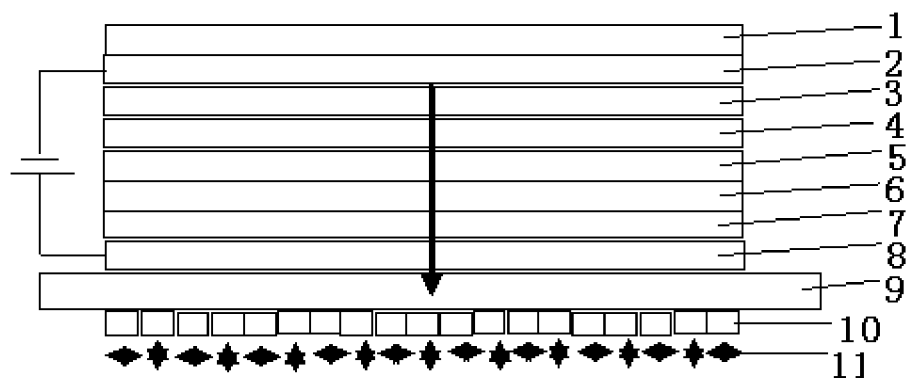
FIG. 1 is a structurally schematic view illustrating an organic electroluminescent display device provided by an embodiment of the present invention.

As illustrated in FIG. 1, a polarizing film 10 is disposed at a light exiting side of an organic electroluminescent display device, and has a plurality of polarization units, and polarization directions of adjacent polarization units differ.

In the above embodiment, by disposing a polarizing film 10 at a light exiting side of the organic electroluminescent display device, and setting a plurality of polarization units on the polarizing film 10, and light polarization directions of adjacent polarization units differ, light extraction efficiency of the whole display device is enhanced. Eventually, display effect of the display device is improved.

For the sake of facilitating understanding of the display device provided by embodiments of the invention, it will be described below in detail in conjunction with attached drawings.

Figure 2:
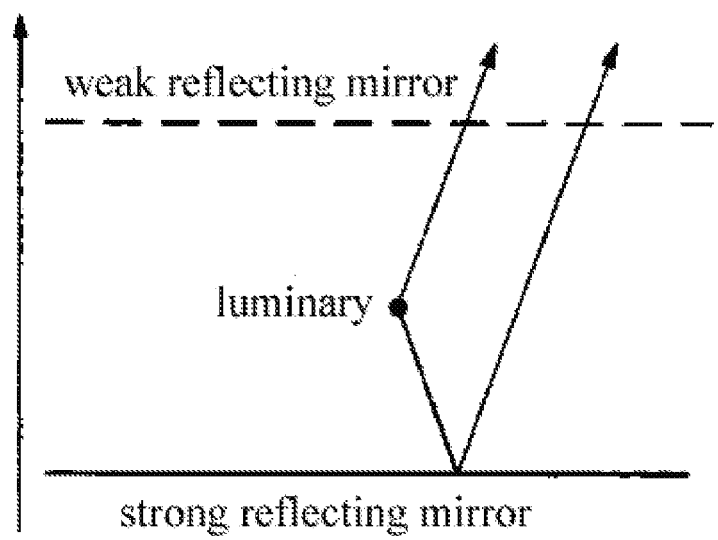
FIG. 2 illustrates a large-angle interference effect of lights emitted from a non-resonant cavity organic electroluminescent display device.
Figure 3:
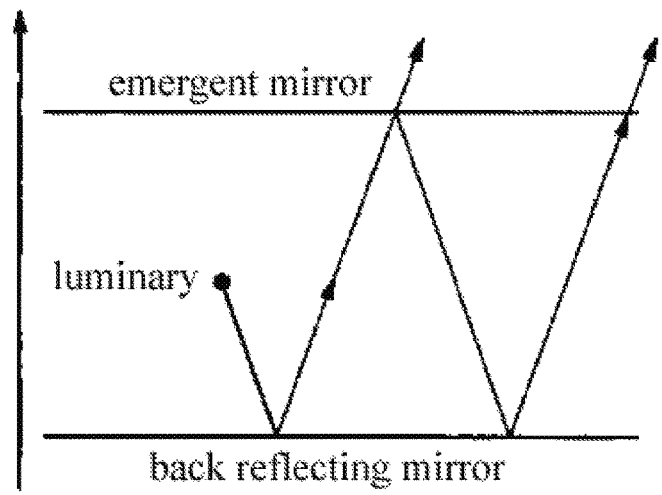
FIG. 3 illustrates large-angle interference and multi-beam interference effects in a micro resonant cavity organic electroluminescent display device.

FIG. 2 is a schematic view illustrating a large-angle interference effect of lights emitted from a non-resonant cavity (weak resonant cavity) organic electroluminescent display device. FIG. 3 is a schematic view illustrating large-angle interference and multi-beam interference effects in a micro resonant cavity organic electroluminescent display device.

Figure 4:
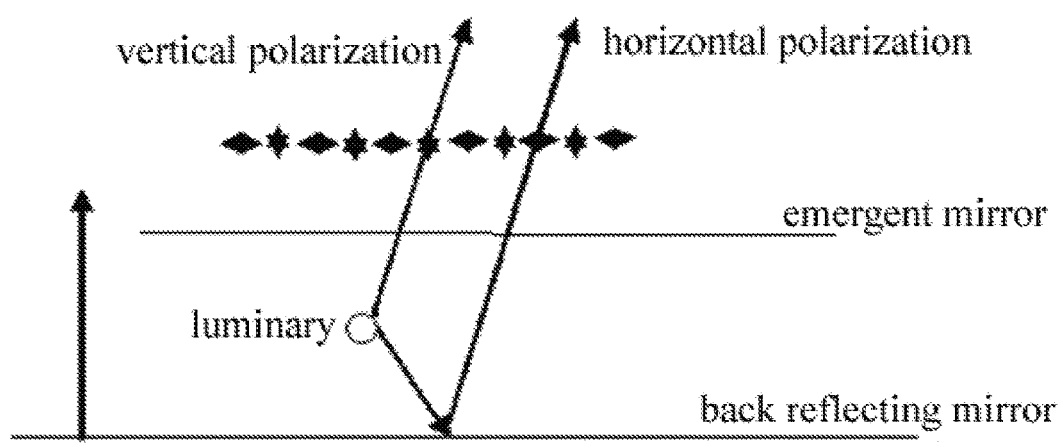
FIG. 4 is a schematic view illustrating the working principle of an organic electroluminescent display device provided by an embodiment of the invention.

As can be seen from FIG. 2 and FIG. 3, a relatively severe interference takes place between outgoing lights of an organic electroluminescent display device with a usual structure. While in the present embodiment, a polarizing film 10 is disposed at a light exiting side of the display device, and the effect is illustrated in FIG. 4. As can be seen from FIG. 4, after irradiated lights pass through the polarizing film 10, polarization directions of adjacent lights are varied. Lights with alternated polarization directions do not satisfy interference conditions, so as to reduce mutual interference of outgoing lights, and to enhance the light extraction efficiency, and eventually, display effect of the display device is improved.

As illustrated in FIG. 1, structure of an organic electroluminescent display device provided by an embodiment of the invention contains a transparent substrate 1, and an anode layer 2, a hole injection layer 3, a hole transportation layer 4, a luminescent layer 5, an electron transportation layer 6, an electron injection layer 7 and a cathode layer 8 that are disposed on the transparent substrate 1 sequentially in a direction away from the transparent substrate 1. Besides, it further includes a sealing film 9 for packaging the transparent substrate 1, the anode layer 2, the hole injection layer 3, the hole transportation layer 4, the luminescent layer 5, the electron transportation layer 6, the electron injection layer 7 and the cathode layer into a whole. Structure of the above display device is packaged by the sealing film 9, to form an integral unit.

For example, different materials may be selected for the fabrication of the transparent substrate 1. For example, the transparent substrate 1 may be of glass or transparent plastic. In this embodiment, the transparent substrate 1 is prepared by using a glass material. The polarizing film 10 is arranged on a back face of the glass substrate 1, namely, the polarizing film 10 is arranged on a face of the transparent substrate 1 facing away from the anode layer 2.

In the present embodiment, the polarizing film 10 is a periodic membrane, namely, polarization units on the polarizing film 10 are arranged periodically. For example, the minimum period is a pixel unit. That is, the organic electroluminescent display device has a plurality of pixel units, and each of the pixel units corresponds to one polarization unit. For example, the plurality of pixel units are arranged in a two-dimensional plane, and each of the pixel units has the same shape as a polarization unit corresponding to it. For example, a pixel unit may be in the shape of a parallelogram, a diamond, a rectangle or a square, and accordingly, each of pixel units is joined to four adjacent pixel units. Polarization direction of each pixel unit is different from the polarization direction of at least one of four adjacent pixel units, or polarization direction of each pixel unit is different from that of four adjacent pixel units. Polarization directions of adjacent pixel units are orthogonal to each other. For example, a plurality of polarization units are arranged in the form of a two-dimensional matrix on a light exiting side of an organic electroluminescent display device. For example, FIG. 1 illustrates a polarization direction 11 of a polarizing film 10. While FIG. 4 illustrates that polarization directions of polarization units in correspondence with adjacent pixel units are orthogonal to each other. It shall be understood that, light extraction efficiency can be enhanced when polarization directions of polarization units in correspondence with adjacent pixel units are just different; and when polarization directions of polarization units in correspondence with adjacent pixel units are orthogonal to each other, light extraction efficiency can be enhanced remarkably.

For example, the polarizing film 10 may be prepared by using a conventional casting method, and it may be made from polyvinyl alcohol (PVA) (as a conventional method, details are omitted here). And adjacent polarization directions are made to be different.

Continue referring to FIG. 1, the organic electroluminescent display device provided by the invention includes a polarizing film 10, a transparent substrate 1, which may be made from glass, or may be made from plastic or other transparent materials, and an anode layer 2 disposed on the transparent substrate 1. The anode layer 2 may adopt a material with high working function, such as transparent indium tin oxide (ITO), and may also adopt transparent carbon nanotube (CNT) or other materials. An ITO anode layer 2 may be deposited and prepared on a glass substrate 1 by using a vacuum magnet sputtering method.

A hole injection layer 3 is deposited on the ITO anode layer 2 by using a vacuum thermal evaporation method. For example, the hole injection layer 3 may be prepared with phthalocyanine copper (CuPc) possessing good hole injection capability.

A hole transportation layer 4 is deposited on the hole injection layer 3 by using a vacuum thermal evaporation method. For example, the hole transportation layer 4 may be prepared with TCTA possessing good hole transportation capability.

A luminescent layer 5 is deposited on the hole transportation layer 4 by using a vacuum thermal evaporation method. For example, the luminescent layer 5 may use a mixed, primary luminescent layer of TCTA and TAZ codoped with green phosphorescent material $Ir(ppy)_3$ and red phosphorescent material $Ir(pq)_2acac$, and meanwhile use a subsidiary luminescent layer of mCP doped with blue phosphorescent material FCNIr. According to principles of colorimetry, wherein, color mixing will happen when luminescent materials emitting three colors of red, green and blue are doped into the same luminous layer and a white color is produced.

An electron transportation layer 6 is deposited on the luminescent layer using a vacuum thermal evaporation method. For example, the electron transportation layer 6 may be prepared with material quinoline aluminum ($Alq_3$) possessing good electron transportation capability.

An electron injection layer 7 is deposited on the electron transportation layer 6 using a vacuum thermal evaporation method. For example, the electron injection layer 7 may be prepared with a material possessing good electron injection capability, such as lithium fluoride (LiF) or other material with low work function.

A Mg/Al cathode layer 8 (being a reflective electrode, by which lights are reflected) with low resistance is deposited on the electron injection layer 7 by a vacuum thermal evaporation method. A voltage is applied across the cathode layer 8 and the anode layer 2 by an externally connected circuit. Electrons are injected from a cathode, holes are injected from an anode, and the electrons and holes encounter at the luminescent layer to generate excitons, so as to excite a luminescent material to give off light.

After manufacture of the organic electroluminescent device is accomplished, for example, a thin film encapsulating layer may be formed on the organic electroluminescent display. For example, the thin film encapsulating layer may be formed through the following steps, firstly, a liquid monomer is quickly evaporated, to be condensed on a base 1 in a liquid form in a vacuum environment, and then this thin film is baked. Thus, the whole organic electroluminescent structure is completely sealed and planarized. For example, the used liquid monomer may be hydrocarbon solution containing an aluminum matrix composite.

Film thickness of the sealing film 9 is in the same order of magnitude as wavelength of visible lights, and thus wide-angle interference is liable to take place. Therefore, in embodiments of the invention, polarizing film 10 on which polarization directions are arranged in an orthogonal and staggering way is provided at a light exiting side, and polarization directions of polarization units on the polarizing film 10 in correspondence with adjacent pixel units are orthogonal. This makes polarization directions of lights emitted from pixel units be orthogonal to each other, not satisfying interference conditions, and thus wide-angle interference taken place between a directly transmitted light and a reflected light passing through a reflective electrode (the cathode layer 8) is reduced. Eventually, light extraction efficiency is enhanced.

The above are merely exemplary embodiments of the present invention, and are not intended to limit the scope of protection of the present invention, which is yet determined by the appended claims.

The present application claims the priority of the Chinese patent application No. 201510601333.4 filed on Sep. 18, 2015, the entirety of which is incorporated herein by reference as a part of the present application.

The invention claimed is:

1. An organic electroluminescent display device, comprising
a polarizing film provided at a light exiting side thereof, the polarizing film possessing a plurality of polarization units, and adjacent polarization units having different polarization directions,
wherein, the organic electroluminescent display device includes a transparent substrate, and an anode layer, a hole injection layer, a hole transportation layer, a luminescent layer, an electron transportation layer, an electron injection layer, and a cathode layer that are disposed on the transparent substrate sequentially in a direction away from the transparent substrate,
the organic electroluminescent display device further includes a sealing film configured to package the transparent substrate, the anode layer, the hole injection layer, the hole transportation layer, the luminescent layer, the electron transportation layer, the electron injection layer, and the cathode layer into a whole,
a thickness of the sealing film is of the same order of magnitude as wavelength of visible lights, and
a material of the anode layer comprises transparent carbon nanotube (CNT), the luminescent layer comprises a primary luminescent layer and a subsidiary luminescent layer, the primary luminescent layer comprises TCTA and TAZ codoped with green phosphorescent material Ir(ppy)$_3$ and red phosphorescent material Ir(pq)$_2$acac, and the subsidiary luminescent layer comprises mCP doped with blue phosphorescent material FCNIr.

2. The organic electroluminescent display device according to claim 1, wherein, the organic electroluminescent display device has a plurality of pixel units, and each of the pixel units at least partially overlaps one of the polarization units in a direction perpendicular to the polarizing film.

3. The organic electroluminescent display device according to claim 2, wherein, each of the pixel units fully overlaps one of the polarization units in a direction perpendicular to the polarizing film.

4. The organic electroluminescent display device according to claim 2, wherein, the plurality of pixel units are arranged in a two-dimensional plane, and each of the pixel units has a same shape as that of a corresponding polarization unit.

5. The organic electroluminescent display device according to claim 1, wherein, the polarizing film is disposed on a face of the transparent substrate facing away from the anode layer.

6. The organic electroluminescent display device according to claim 1, wherein, the polarizing film contacts the sealing film and is disposed on a side of the sealing film away from the cathode layer.

7. The organic electroluminescent display device according to claim 1, wherein, the polarizing film is a polyvinyl alcohol polarizing film.

8. The organic electroluminescent display device according to claim 1, wherein, the polarization directions of adjacent polarization units are orthogonal to each other.

9. The organic electroluminescent display device according to claim 1, wherein, the transparent substrate comprises a material of glass or transparent plastic.

10. The organic electroluminescent display device according to claim 1, wherein, the anode layer is a transparent indium tin oxide layer or a transparent carbon nanotube layer.

* * * * *